(12) United States Patent
Wang

(10) Patent No.: US 10,921,158 B2
(45) Date of Patent: Feb. 16, 2021

(54) POWER SUPPLY GENERATING CIRCUIT, CAPACITIVE ARRAY SENSING APPARATUS AND TERMINAL DEVICE

(71) Applicant: SHENZHEN GOODIX TECHNOLOGY CO., LTD., Shenzhen (CN)

(72) Inventor: Chengzuo Wang, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 291 days.

(21) Appl. No.: 16/125,403

(22) Filed: Sep. 7, 2018

(65) Prior Publication Data

US 2019/0025091 A1   Jan. 24, 2019

Related U.S. Application Data

(63) Continuation of application No. PCT/CN2017/093541, filed on Jul. 19, 2017.

(51) Int. Cl.
| | | |
|---|---|---|
| G01D 5/24 | (2006.01) | |
| H03K 3/012 | (2006.01) | |
| H03K 17/96 | (2006.01) | |
| H03K 5/04 | (2006.01) | |

(52) U.S. Cl.
CPC .......... *G01D 5/2405* (2013.01); *H03K 3/012* (2013.01); *H03K 5/04* (2013.01); *H03K 17/9622* (2013.01); *H03K 2217/0081* (2013.01); *H03K 2217/94042* (2013.01)

(58) Field of Classification Search
CPC ..... G01D 5/2405; G06F 3/044; G06F 3/0418; H03K 17/9622; H03K 5/04; H03K 3/012; H03K 17/975; H03K 2217/0081; H03K 2217/94042; H03K 2217/96; H03K 2217/9607; H03K 2217/960725; H03K 2217/0036

See application file for complete search history.

(56) References Cited

U.S. PATENT DOCUMENTS

| | | |
|---|---|---|
| 5,010,261 A | 4/1991 | Steigerwald |
| 2006/0186933 A1 | 8/2006 | Kimura et al. |
| 2012/0169660 A1* | 7/2012 | Seo .......................... G06F 3/044 345/174 |

(Continued)

FOREIGN PATENT DOCUMENTS

| | | |
|---|---|---|
| CN | 103780229 A | 5/2014 |
| CN | 105335737 A | 2/2016 |

(Continued)

*Primary Examiner* — Son T Le

(57) ABSTRACT

A power supply generating circuit includes a driving voltage generating circuit and a pulse generating circuit, where the driving voltage generating circuit is configured to generate a driving voltage signal, the pulse generating circuit receives the driving voltage signal through a first input end and receives a communication signal through a second input end; at a negative phase stage of the communication signal, the first output end does not output the driving voltage signal, and the pulse generating circuit outputs a charge to an energy storage end, where the charge is input from the first output end.

18 Claims, 6 Drawing Sheets

(56) References Cited

U.S. PATENT DOCUMENTS

| | | | |
|---|---|---|---|
| 2013/0321005 A1* | 12/2013 | Hargreaves | G06F 3/0443 324/679 |
| 2015/0155865 A1 | 6/2015 | Komiyama et al. | |
| 2016/0248421 A1 | 8/2016 | Komiyama et al. | |
| 2018/0024678 A1* | 1/2018 | Nitobe | G06F 3/0412 345/174 |
| 2019/0026521 A1 | 1/2019 | Du | |

FOREIGN PATENT DOCUMENTS

| | | |
|---|---|---|
| CN | 106130526 A | 11/2016 |
| CN | 106796658 A | 5/2017 |
| CN | 206226402 U | 6/2017 |
| DE | 102009006618 A1 | 8/2010 |
| EP | 2874294 A1 | 5/2015 |

* cited by examiner

US 10,921,158 B2

POWER SUPPLY GENERATING CIRCUIT, CAPACITIVE ARRAY SENSING APPARATUS AND TERMINAL DEVICE

CROSS-REFERENCE TO RELATED APPLICATIONS

The present application is a continuation of international application No. PCT/CN2017/093541, filed on Jul. 19, 2017, which is hereby incorporated by reference in its entireties.

TECHNICAL FIELD

Embodiments of the present disclosure relate to the field of capacitive array sensing technologies, and in particular, to a power supply generating circuit, a capacitive array sensing apparatus and a terminal device.

BACKGROUND

A capacitive array sensor is widely applied to various consumer terminal electronic devices, such as a capacitive array sensor for touch control on a display screen of a terminal device, or a capacitive array sensor for identity information authentication (a human body/biometric information identification) in a terminal device. Today, more and more capacitive array sensors adopt a "floating ground technology" in order to enhance user experience and/or improve sensor performance.

Particularly, when a voltage of a circuit is calculated, a potential of a certain point is first designated as zero, that is, this point is a "ground". However, in some circuits, in order to facilitate calculation, a potential of another point may be designated as zero, and this point is called a "floating ground" with respect to the previous "ground". In the field of capacitive array sensing apparatus, it is assumed that a capacitor generated by a contact point of a human body and a dielectric layer of a circuit is $C_X$, and a $T_X$ signal is an excitation signal for detecting the $C_X$. If an amplitude of the TX signal increases, a less $C_X$ may be detected, or a magnitude of a detection signal that may be obtained increases in a same $C_X$ case. Namely, the use of the "floating ground" may improve performance of a capacitive array sensor.

However, there may be a greater parasitic capacitor between the "floating ground" and a "common ground" (also called a "real ground" or a "device common ground" or a "device ground") of the capacitive array sensor when the "floating ground" is adopted. In the prior art, a commonly used solution is to bridge a discharge switch between the "floating ground" and the "common ground" to discharge an accumulated charge. However, discharging the charge stored in the parasitic capacitor directly to the "common ground" may cause a great charge loss, and then may result in a lower utilization rate of an output charge of a battery of a terminal device.

SUMMARY

A power supply generating circuit, a capacitive array sensing apparatus and a terminal device are provided, and a utilization rate of an output charge of the power supply generating circuit could be improved.

According to a first aspect, a power supply generating circuit is provided, including:

a driving voltage generating circuit, configured to generate a driving voltage signal; and a pulse generating circuit, including a first input end, a second input end, a first output end and an energy storage end, where the pulse generating circuit receives the driving voltage signal through the first input end and receives a communication signal through the second input end; at a positive phase stage of the communication signal, the pulse generating circuit outputs the driving voltage signal from the first output end; and at a negative phase stage of the communication signal, the first output end does not output the driving voltage signal, and the pulse generating circuit outputs a charge to the energy storage end, where the charge is input from the first input end.

An embodiment of the present disclosure provides a power supply generating circuit, by embedding a pulse generating circuit in the power supply generating circuit, the pulse generating circuit is capable of recycling a charge when a $T_X$ is at a negative phase stage, where the charge is stored in a foregoing parasitic capacitor when the $T_X$ is at a positive phase stage, thereby a utilization rate of an output charge of the power supply generating circuit is effectively improved.

In some possible implementation manners, the pulse generating circuit includes: a control unit, a first branch and a second branch, where at the positive phase stage of the communication signal, the control unit controls the first branch to output the driving voltage signal from the first output end; and at the negative phase stage of the communication signal, the control unit controls the first branch so that the first output end does not output the driving voltage signal, and controls the second branch to output the charge to the energy storage end, where the charge is input from the first output end.

In some possible implementation manners, the control unit is configured to generate a plurality of control signals according to the communication signal, and the plurality of control signals are used to control a switch in the first branch and a switch in the second branch.

In some possible implementation manners, the first branch includes a first switch, the driving voltage generating circuit is connected to the first output end through the first switch, the plurality of control signals include a first control signal, and the first control signal is used to turn on the first switch at the positive phase stage of the communication signal and to turn off the first switch at the negative phase stage of the communication signal.

In some possible implementation manners, the second branch includes an inductor, a second switch and a third switch, the first output end is connected to the energy storage end through the inductor and the second switch, a first port is disposed between the inductor and the second switch, the first port is connected to a device ground through the third switch, the plurality of control signals include a second control signal and a third control signal, the second control signal is used to turn off the second switch at an initial time of the negative phase stage of the communication signal and to turn on the second switch when a voltage of the first output end decreases to a voltage of the device ground, and the third control signal is used to turn on the third switch at the initial time of the negative phase stage of the communication signal and to turn off the third switch when the voltage of the first output end decreases to the voltage of the device ground.

In some possible implementation manners, the second branch further incudes a fourth switch, the first output end is connected to the device ground through the fourth switch, the plurality of control signals include a fourth control signal, and the fourth control signal is used to turn on the fourth switch when the voltage of the first output end is less than or equal to the voltage of the device ground.

Accordingly, when the voltage of the first output end is equal to the voltage of the device ground, it may be ensured that the voltage of the first output end is locked at the voltage of the device ground, and thus a recycle rate of a charge stored in a parasitic capacitor can be effectively improved.

In some possible implementation manners, the second branch further includes a fifth switch, the fifth switch is connected in parallel to two ends of the inductor, the plurality of control signals include a fifth control signal, and the fifth control signal is used to turn on the fifth switch at the positive phase stage of the communication signal and to turn off the fifth switch at the negative phase stage of the communication signal.

According to a fifth switch in an embodiment of the present disclosure, it can be ensured that an inductor is in a reset state at a positive phase stage of a communication signal TX_VCC until an initial time of a negative phase stage of the TX_VCC, and thus a recycle rate of a charge stored in a parasitic capacitor can be effectively improved.

In some possible implementation manners, the third switch, the fourth switch and the fifth switch are turned on when control signals received are at positive phase stages, and the first switch and the second switch are turned on when phase stages of control signals received are negative phase stages.

In some possible implementation manners, the control unit includes a first comparator and a second comparator, the first comparator is configured to compare a potential of the first output end with a potential of the device ground and output a first signal, the second comparator is configured to compare a potential of the energy storage end with a protentional of the first port and output a second signal, and the first signal or the second signal is used to control the control unit to generate the plurality of control signals.

In some possible implementation manners, a positive phase input end of the first comparator is connected to the device ground, a negative phase input end of the first comparator is connected to the first output end, a positive phase input end of the second comparator is connected to the energy storage end, and a negative phase input end of the second comparator is connected to the first port.

In some possible implementation manners, the power supply generating circuit further includes a power diode and a first capacitor, the pulse generating circuit further includes a second output end, the driving voltage generating circuit is connected to the second output end through the power diode, and the first output end is connected to the second output end through the first capacitor.

In some possible implementation manners, the energy storage end is connected to a system power supply, or the energy storage end is connected to at least one module in a terminal device through a clamp circuit, and an output voltage of the clamp circuit serves as a supply voltage of the at least one module.

According to a second aspect, a capacitive array sensing apparatus is provided, including: a capacitive array sensor, and the power supply generating circuit according to any one of the implementation manners in the first aspect, where the power supply generating circuit is configured to supply power to the capacitive array sensor.

According to a capacitive array sensing apparatus of an embodiment of the present disclosure, a charge in a parasitic capacitor between a sensor ground (that is, a floating ground) and a device ground is recycled and reused through a power supply generating circuit, and not only can a utilization rate of an output charge of the power supply generating circuit be improved, but also power consumption of a capacitive array sensor can be reduced.

In some possible implementation manners, the capacitive array sensor includes a sensor ground of the capacitive array sensor, a power supply end and a communication interface of the capacitive array sensor, the first output end is connected to the sensor ground, the second output end is connected to the power supply end, and the second input end is connected to the communication interface.

In some possible implementation manners, at the negative phase stage of the communication signal, the charge input from the first output end is a charge stored in a parasitic capacitor between a sensor ground and a device ground.

In some possible implementation manners, the capacitive array sensor includes a metal plate, a multiplexer, a scanning module and a capacitance detecting circuit, the scanning module is connected to the second input end through the communication interface, the scanning module is further connected to the capacitance detecting circuit through the multiplexer and the metal plate, and the capacitive array sensor is configured to generate a second capacitor through the metal plate and a human body, to control the multiplexer through the scanning module to convey a charge in the second capacitor to the capacitance detecting circuit, and to detect a capacitance value of the second capacitor through the capacitance detecting circuit.

According to a third aspect, a terminal device is provided, including the capacitive array sensing apparatus according to any one of the implementation manners in the second aspect.

According to a terminal device of an embodiment of the present disclosure, duration of use of the terminal device can be improved, and then user experience is improved.

DESCRIPTION OF EMBODIMENTS

A clear description of technical solutions of embodiments of the present application will be given below with reference to the accompanying drawings in the embodiments of the present application.

For ease of understanding, a structure of a circuit of a capacitive array sensor that adopts a "floating ground technology" in the prior art will be described below with reference to FIG. 1.

Figure 1:
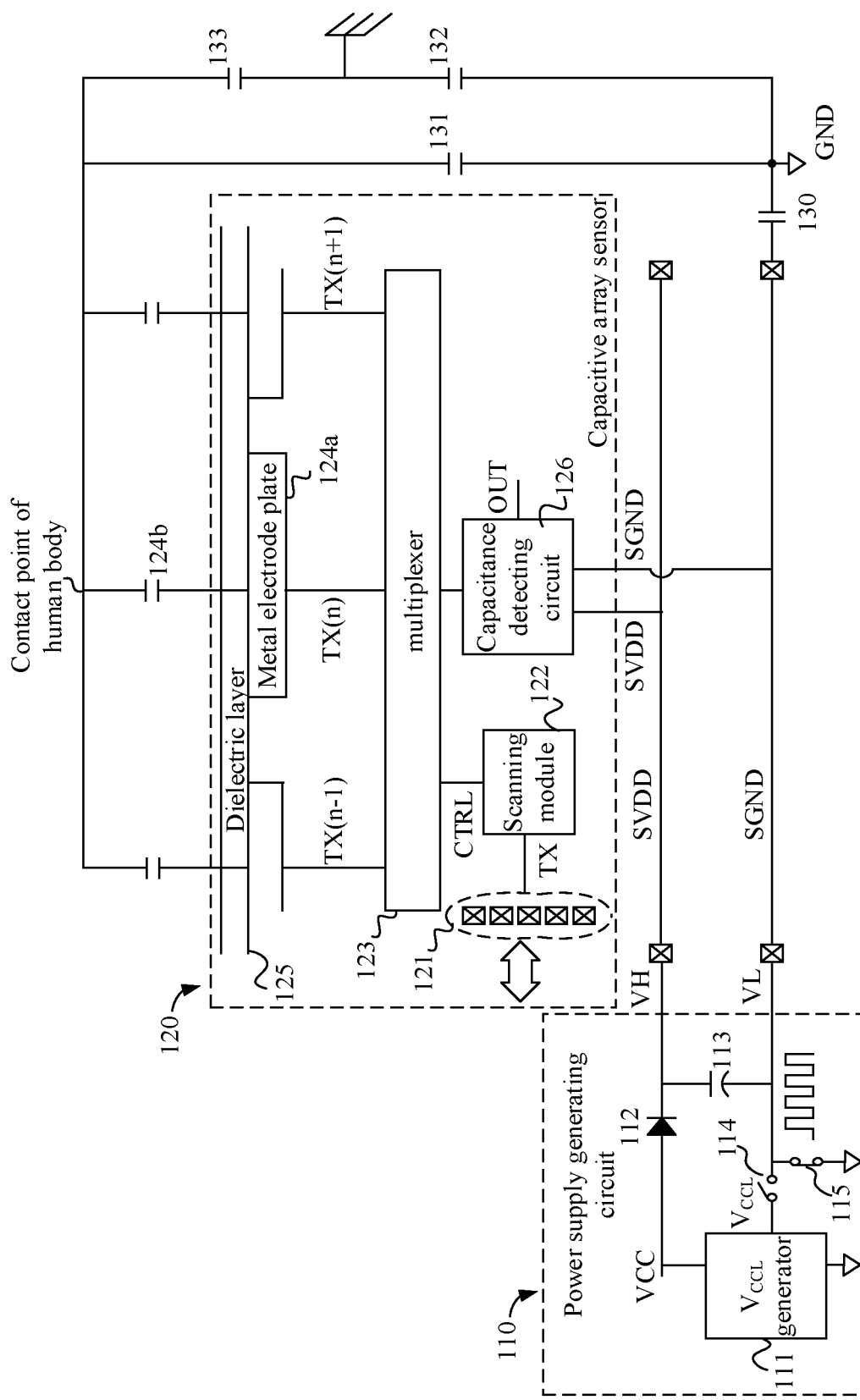
FIG. 1 is structural diagram of a capacitive array sensor circuit in the prior art.

As shown in FIG. 1, a circuit structure includes a capacitive array sensor 120 and a power supply generating circuit 110, where the capacitive array sensor 120 includes: a communication interface 121, a scanning module 122, a multiplexer 123, a plurality of top layer metal electrode plates (a metal electrode plate 124a is exemplarily shown in FIG. 1), a dielectric layer 125, a capacitance detecting circuit 126 and the like.

In the circuit shown in FIG. 1, the scanning module 122 is connected to the capacitance detecting circuit 126 through the multiplexer 123 and the metal electrode plate 124a. The metal electrode plate 124a is configured to form a capacitor at a contact point of a human body between the metal electrode plate 124a and the human body (such as a finger), the multiplexer 123 selects at least one capacitor through a control detection signal CTRL, so that the foregoing at least one capacitor is strobed and is connected to the capacitance detecting circuit 126, and the capacitance detecting circuit 126 is configured to detect a capacitance value of the strobed at least one capacitor, thereby human body contact information (containing position information or distance information) may be obtained.

The CTRL is a control detection signal sent by the scanning module 122 to the multiplexer 123, and is used to change turnon and turnoff of a module by changing a voltage of a pin according to an actual use requirement and a data manual provided by a power supply manufacture, so as to achieve a purpose of controlling a system. For example, when there is one multiplexer 123, the scanning module 122 may control the multiplexer 123 through the CTRL to select one capacitor $C_{X(n)}$, and convey the capacitor $C_{X(n)}$ to the capacitance detection circuit 126. It can be understood that, a capacitor is also called "an amount of capacitance" and refers to an amount of charge storage under a given potential difference; namely, the capacitor $C_{X(n)}$ in an embodiment of the present disclosure may be understood as: an amount of capacitance generated by a metal electrode plate in the capacitive array sensor 120 through a dielectric layer and a human body.

In addition, the scanning module 122 is further connected to the power supply generating circuit 110 through the communication interface 121. As a power supply for the capacitive array sensor 120, the power supply generating circuit 110 may specifically include a driving voltage ($V_{CCL}$) generator 111, a power diode 112, a capacitor 113, a switch 115 and a switch 114. The $V_{CCL}$ generator 111 is connected to a sensor ground (Sensor GND, SGND) of the capacitive array sensor 120 through the switch 114, the switch 114 is connected to a device ground through the switch 115 on one side close to the sensor, the $V_{CCL}$ generator 111 is further connected to a power supply end (Sensor VDD, SVDD) of the capacitive array sensor 120 through the power diode 112, and the sensor ground SGND is connected to the power supply end SVDD through the capacitor 113.

It should be understood that, in some implementations, the device ground GND may also be called a "common ground", a "real ground", a "device common ground" or the like, such as a common line in three-wire communications that is commonly used in serial communications. The sensor ground SGND is a ground of the capacitive array sensor 120, the sensor ground SGND may also be called a "floating ground", and the power supply end SVDD is a port of a power supply (the power supply generating circuit 110) of the capacitive array sensor 120. Particularly, in a process of supplying power to the capacitive array sensor 120 by the power supply generating circuit 110, the scanning module 122 sends a detection signal TX to the communication interface 121, and the TX is an excitation signal for detecting the $C_{X(n)}$; and after receiving the detection signal TX, the communication interface 121 converts it into a signal with a signal amplitude of VCC, i.e., a communication signal TX_VCC, and sends the communication signal TX_VCC to the power supply generating circuit 110. The power supply generating circuit 110 generates a first pulse signal VL and a second pulse signal VH according to a driving voltage generated by the $V_{CCL}$ generator 111 and the received TX_VCC, and the power supply end SVDD and the sensor ground SGND of the capacitive array sensor 120 are configured to receive the second pulse signal VH and the first pulse signal VL, respectively. The $V_{CCL}$ generator 111 is configured to generate a driving voltage signal with an amplitude of VCCL.

Further, turnon and turnoff of the switch 114 is controlled through the detection signal TX, so that the power supply generating circuit 110 generates the first pulse signal VL and the second pulse signal VH according to the driving voltage generated by the $V_{CCL}$ generator 111 and the received TX_VCC. Particularly, when the TX is at a positive phase stage, the switch 114 is turned on, and the $V_{CCL}$ generator 111 will pull a level of the VL up to a VCCL level. Since an output end of the first pulse signal VL is connection to an output end of the second pulse signal through the capacitor 113, voltages of two ends of the capacitor 113 cannot change suddenly, that is, an amplitude of the VH will also be raised to VCCL+VCC synchronously, and at this time, the power diode 112 is reversely biased, and then in an off state. When the TX is at a negative phase stage, the switch 114 is turned off, and a potential of the sensor ground SGND will be pulled down to a potential equal to a potential of the device ground GND, thereby a "floating ground" voltage is provided for the capacitive array sensor 120.

It can be seen from the above analysis that, the VL is a pulse signal with an amplitude of VCCL and a same frequency and a same phase as that of the TX; therefore, the sensor ground SGND of the capacitive array sensor 120 is also a pulse signal with a same frequency and a same phase as that of the TX with respect to the device ground GND, and the VH is a pulse signal with an amplitude of VCCL+VCC and a same frequency and a same phase as that of the TX. In addition, since $C_{X(n)}$ used to characterize the human body contact information is an approximate signal with respect to the device ground GND, if a capacitance of a parasitic capacitor 131 of the finger to the device ground GND is great enough, the scanning module will obtain the detection signal TX with an amplitude of VCCL+VCC, and then an amplitude of a TX(n) signal acting on the capacitor $C_{X(n)}$ is also VCCL+VCC.

Figure 2:
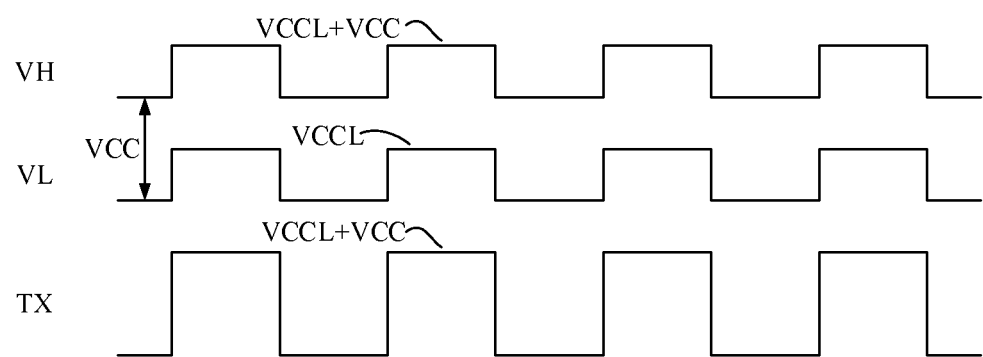
FIG. 2 is a schematic diagram of signal waveforms according to an embodiment of the present disclosure.

That is, as shown in FIG. 2, the VL is a pulse signal with an amplitude of VCCL and a same frequency and a same phase as that of the TX, the VH is a pulse signal with an amplitude of VCCL+VCC and a same frequency and a same phase as that of the TX, and an amplitude of the TX is also VCCL+VCC.

It can be known from a principle of capacitance detection that, if an amplitude of the TX signal increases, a less $C_{X(n)}$ may be detected, or an amount of detection signals that may be obtained increases in a same $C_{X(n)}$ case; therefore, the use of the "floating ground technology" may improve performance of a capacitive array sensor, and it is widely applied.

In other words, during the operation of the capacitive array sensor 120, a voltage of the power supply end SVDD and a voltage of the sensor ground SGND are floating, and A potential difference between a potential of the power supply end SVDD and a potential of the sensor ground SGND maintains a difference value of about VCC, so that the sensor obtains the detection signal TX with an amplitude greater than VCC of a system power supply, thereby the performance of the sensor is improved.

However, it should be noted that, for the power supply generating circuit 110 shown in FIG. 1, when the TX is at the positive phase stage, the switch 114 is turned on, and a capacitor 130 is also charged to VCCL; and when the TX is at the negative phase stage, the switch 114 is simply turned off, the potential of the sensor ground SGND is pulled down to a potential equal to the potential of the device ground GND, and the voltage of the capacitor 130 will be discharged to the device ground GND.

The capacitor 130 is a parasitic capacitor $C_{PAR}$ of the SGND to the GND, the $C_{PRA}$ is equal to a sum of the capacitor 131, a capacitor 132 and a capacitor 133, the capacitor 132 is a parasitic capacitor $C_S$ of the device ground GND to a ground, the capacitor 131 is a parasitic capacitor $C_H$ of the finger to the device ground GND, the capacitor 133 is a parasitic capacitor $C_M$ of the finger to the ground, and a capacitor 124b is a capacitor at the contact point of the human body between the human body (such as the finger) and the metal electrode plate 124a.

In a practical project, the CPAR has an order of hundreds of picofarads (pF), generally ranging from 200 pF to 800 pF, and the order specifically depends on factors, such as implementation manners of the capacitive array sensor 120 and a number of sensing units it contains. In the circuit structure shown in FIG. 1, the first pulse signal VL of the sensor ground SGND charges and discharges the CPAR, which will produce great consumption, for example, a loss power of the CPAR in an operation process of the sensor may be calculated by a following formula:

$$P_{Cpar\_Loss} = I_{Cpar\_Loss} \times V_{CCL} = C_{PAR} V_{CCL} f_{TX} \times V_{CCL} \quad (1)$$

$P_{Cpar\_Loss}$ is the loss power of the $C_{PAR}$ in the operation process of the sensor, $I_{Cpar\_Loss}$ is an equivalent loss current, $V_{CCL}$ is equal to VCCL, and $f_{TX}$ is a frequency of the TX signal.

For example, if $C_{PAR}$=200 pF, $V_{CCL}$=2.8V, and $f_{TX}$=2 MHz, it can be known from the formula (1) that the lost power is 1.12 mA×2.8V=3.136 mW; and if $C_{PAR}$=800 pF, $V_{CCL}$=10V, and $f_{TX}$=2 MHz, the lost power is up to 16.0 mA×10.0V=160 mW.

If a power of a capacitive array sensor is about 10 mA×2.8V=28 mW, the lost power of the $C_{PAR}$ is 11.2%~571.4% of a power of a sensor array. For performance of the capacitive array sensor, a greater driving voltage VCCL, a faster TX frequency or a larger sensor array (the larger the sensor array is, the greater the $C_{PAR}$ is) may be generally used, and the CPAR loss will be very great, so that overall power consumption of the sensor is very great, resulting in shortened duration of use of a battery of a terminal device and reduced user experience.

In order to solve a disadvantage of a great loss in the prior art, an embodiment of the present disclosure provides a power supply generating circuit, which may be applied for supplying power to a capacitive array sensor. Particularly, a pulse generating circuit is embedded in the power supply generating circuit, so that the pulse generating circuit is capable of recycling and reusing a charge in a parasitic capacitance between a sensor ground (that is, a floating ground) and a device ground when a TX is at a negative phase stage, and not only is a utilization rate of an output charge of the power supply generating circuit improved, but also power consumption of the capacitive array sensor is reduced.

In addition, a technical solution of the embodiment of the present disclosure may also support a greater floating voltage, a faster TX frequency, and a larger array area, thereby a capacitive array sensor with low power consumption and high performance is implemented.

Figure 3:
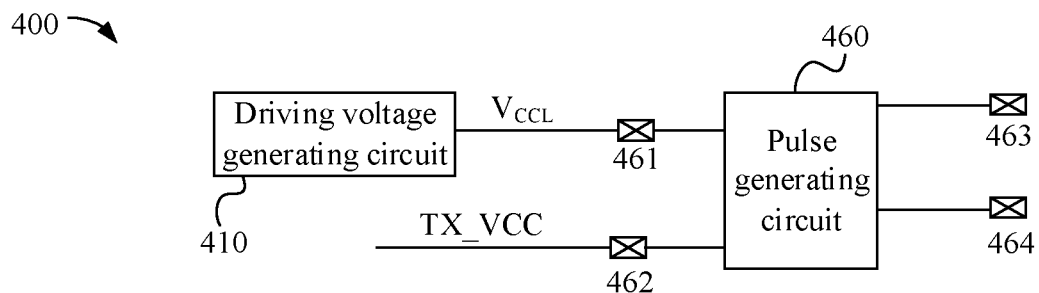
FIG. 3 is a principle diagram of a power supply generating circuit according to an embodiment of the present disclosure.

FIG. 3 is a schematic structural diagram of a power supply generating circuit 400 according to an embodiment of the present disclosure.

As shown in FIG. 3, the power supply generating circuit 400 includes: a driving voltage generating circuit 410, configured to generate a driving voltage signal; and a pulse generating circuit 460, including a first input end 461, a second input end 462, a first output end 463 and an energy storage end 464, where the pulse generating circuit 460 is configured to receive a driving voltage signal VCCL through the first input end 461 and receive a communication signal TX_VCC through the second input end 462, output the driving voltage signal VCCL from the first output end 463 at a positive phase stage of the communication signal, not output the driving voltage signal VCCL from the first output end 463 at a negative phase stage of the communication signal, and output a charge to the energy storage end 464, where the charge is input from the first input end 463. For convenience of description, the charge that is output from the first output end 463 to the energy storage end 464 is called a $V_{ER}$.

A power supply generating circuit according to an embodiment of the present disclosure is described in detail below with reference to FIG. 4.

Figure 4:
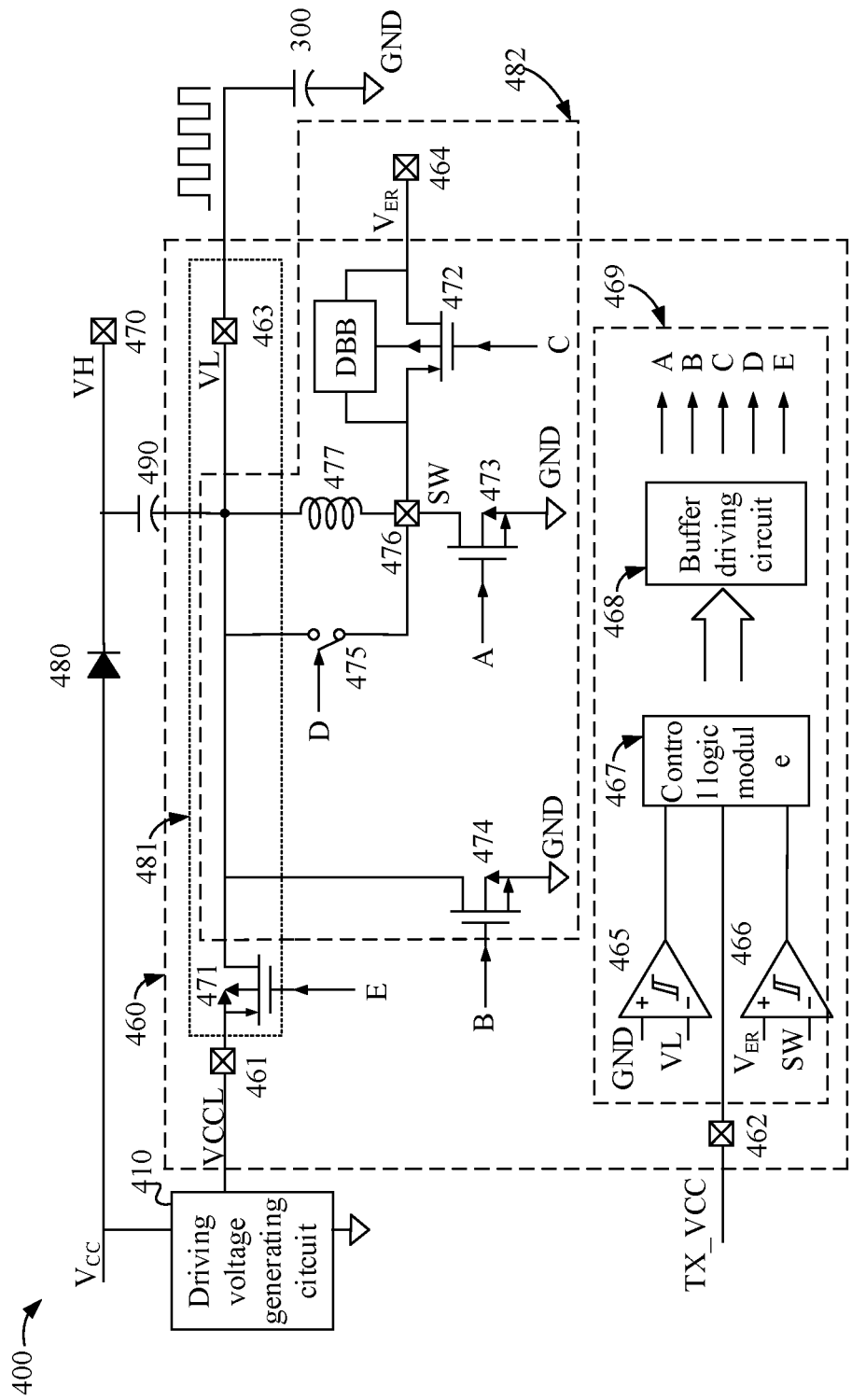
FIG. 4 is a principle diagram of another power supply generating circuit according to an embodiment of the present disclosure.

Optionally, As shown in FIG. 4, the pulse generating circuit 460 includes: a control unit 469, a first branch 481 and a second branch 482, where the control unit 469 is configured to control the first branch to output the driving voltage signal VCCL from the first output end at the positive phase stage of the communication signal TX_VCC, control the first branch 481 to not output the driving voltage signal VCCL from the first output end at the negative phase stage of the communication signal TX_VCC, and control the second branch 482 to output the charge to the energy storage end 464, where the charge is input from the first output end 463.

In addition, it should be noted that, since each operation period of the second branch 482 of the embodiment of the present disclosure occurs only in the negative phase stage of the TX_VCC, operation periods of the second branch 482 are discrete.

Particularly, the control unit 469 is configured to generate a plurality of control signals according to the communication signal TX_VCC, and the plurality of control signals are used to control a switch in the first branch 481 and a switch in the second branch 482. For example, as shown in the drawing, a first control signal for controlling a first switch 471 is denoted as E, a second control signal for controlling a second switch 472 is denoted as C, a third control signal for controlling a third switch 437 is denoted as A, a fourth control signal for controlling a fourth switch 474 is denoted as B, and a fifth control signal for controlling a fifth switch 475 is denoted as D.

As an embodiment, as shown in FIG. 4, the first branch 481 may include a first switch 471, the driving voltage generating circuit 410 is connected to the first output end 463 through the first switch 471, and the plurality of control signals include a first control signal E, and the first control signal E is used to turn on the first switch 471 at the positive phase stage of the communication signal TX_VCC and to turn off the first switch 471 at the negative phase stage of the communication signal TX_VCC.

Particularly, when the TX_VCC is at the positive phase stage, the first switch 471 is turned on, and the driving voltage generating circuit 410 will pull a level of the first output end 463 up to VCCL; and when the TX_VCC is at the negative phase stage, the first switch 471 is turned off, and the driving voltage generating circuit 410 will not pull the level of the first output end 463 up to VCCL.

As another embodiment, as shown in FIG. 4, the second branch 482 includes an inductor 477, a second switch 472 and a third switch 473, the first output end is connected to the energy storage end 464 through the inductor 477 and the second switch 472, a first port 476 is disposed between the inductor 477 and the second switch 472, the first port 476 is connected to a device ground GND through the third switch 473, and the plurality of control signals include a second control signal C and a third control signal A, the second control signal C is used to turn off the second switch 472 at an initial time of the negative phase stage of the communication signal TX_VCC and to turn on the second switch 472 when a voltage of the first output end 463 decreases to a voltage of the device ground GND, and the third control signal A is used to turn on the third switch 473 at the initial time of the negative phase stage of the communication signal TX_VCC and to turn off the third switch 473 when the voltage of the first output end 463 decreases to the voltage of the device ground GND.

Particularly, when a TX is at a negative phase stage, a first switch 471 is turned off, and the driving voltage generating circuit 410 will not pull a level of the first output end 463 up to VCCL. In addition, when the TX_VCC is at the initial time of the negative phase stage, the second switch 472 is turned on and the third switch 473 is turned off, and a charge stored in a capacitor 300 at the positive phase stage of the TX_VCC is transferred to the inductor 477; and when the voltage of the first output end 463 decreases to the voltage of the GND, the charge in the inductor 477 is transferred to an energy storage end 464 by turning off the second switch 472 and turning on the third switch 473. Thus, recycle and reuse of a charge stored in the capacitor 300 are implemented.

In other words, a technical solution of the embodiment of the present disclosure is that a turnon period of the second branch 482 starts when a TX_VCC is at the initial time of the negative phase stage, and the charge stored in the capacitor 300 is transferred to the inductor 477; after a voltage level of a sensor ground SGND decreases to a voltage level of the device ground GND, the turnon period of the second branch 482 ends; and then a turnoff period of the second branch 482 starts, energy stored in the inductor 477 is transferred to the energy storage end 464, and thus recycle and reuse of the charge stored in the capacitor 300 are implemented.

In the embodiment of the present disclosure, the turnon period of the second branch 482 $T_{ON}$ is equal to one quarter of a LC resonance period, that is:

$$T_{ON} = \frac{1}{4} \times T_{LC} \qquad (2)$$
$$= \frac{1}{4} \times 2\pi\sqrt{LC_{PAR}}$$
$$= \frac{\pi\sqrt{LC_{PAR}}}{2}$$

It can be known from the formula (2) that, the $T_{ON}$ is determined by the capacitor 300 and the inductor 477, the charge in the capacitor 300 may be generally obtained by testing. However, a constraint condition of the $T_{ON}$ is that the $T_{ON}$ is generally less than 1/20 of a period of the TX, and then the required inductor 477 may be obtained by calculating according to the formula (2). Under a premise of determination of the capacitor 300, the greater the selected inductor 477 is, the longer the $T_{ON}$ is, a response time requirement for other circuits reduces, and a decrease of a first pulse signal VL is longer along time; however, the less the selected inductor 477 is, the shorter the $T_{ON}$ is, the first pulse signal VL becomes closer to an ideal pulse signal, and the response time requirement for other circuits increases.

If initial energy stored in the capacitor 300 is entirely transferred to the inductor 477, that is:

$$0.5 \times C_{PAR} \times V_{CCL}^2 = 0.5 \times L \times iL_{PK}^2 \qquad (3)$$

a peak current from the inductor 477 is:

$$iL_{PK} = \sqrt{\frac{C_{PAR}}{L}} V_{CCL} \qquad (4)$$

A Boost freewheel time $T_{OFF'}$ may be obtained according to a current-voltage formula of an inductor, that is:

$$T_{OFF'} = \frac{iL_{PK} \times L}{V_{ER}} = \frac{\sqrt{L \times C_{PAR}} \times V_{CCL}}{V_{ER}} \qquad (5)$$

A relationship between $T_{OFF'}$ and $T_{ON}$ may be obtained according to the formula (2), that is:

$$T_{OFF'} = \frac{2}{\pi} \times T_{ON} \times \frac{V_{CCL}}{V_{ER}} \qquad (6)$$

It can be known that, the $T_{ON}$ is at most 1/20 of the period of the TX, that is, the $T_{ON}$ accounts for at most 1/10 of the negative phase of the TX. That is, in a case of $V_{ER}$=VCC, the greater VCCL is, the longer the $T_{OFF'}$ is. That is, it is ensured that VCCL is not much greater than $V_{ER}$, namely, it is ensured that VCCL is not much greater than VCC, and then the second branch 482 must operate in a discontinuous current mode (Discontinuous Current Mode, DCM).

Namely, in an embodiment of the present disclosure, under a premise that it is ensured that an operation mode of an embedded second branch 482 is a DCM, the highest "floating ground" voltage VCCL that may be used in the embodiment of the present disclosure may be at least about ten times that of a system power supply VCC. However, in the prior art, a loss a parasitic capacitance brings under the same condition is extremely incomparable; therefore, the present disclosure has a great advantage of low power consumption in comparison with the prior art.

Optionally, in an embodiment of the present disclosure, as shown in FIG. 4, the control unit 469 may include a first comparator 465 and a second comparator 466, the first comparator 465 is configured to compare a potential of the first output end 463 with a potential of the device ground and output a first signal, i.e., outputting a first signal by comparing the VL with the GND, the second comparator 466 is configured to compare a potential of the energy storage end 464 with a protentional of the first port 476 and output a second signal, i.e., outputting a second signal by comparing the $V_{ER}$ with a SW, and the first signal or the second signal is used to control the control unit 469 to generate the plurality of control signals.

Particularly, when the TX_VCC is at the initial time of the negative phase stage, a charge stored in the capacitor 300 at the positive phase stage of the TX_VCC is transferred to the inductor 477 by turning off the second switch 472 and turning on the third switch 473; when it is determined by the first comparator 465 that the voltage of the first output end 463 decreases to the voltage of the GND, the second switch 472 is turned on and the third switch 473 is turned off, and the charge in the inductor 477 is transferred to the energy storage end 464; and then when it is determined by the second comparator 466 that a voltage of the first port 476 decreases to the voltage of the energy storage end 464, the charge in the inductor 477 is transferred to the energy storage end 464 by turning off the second switch 472, and recycle and reuse of the charge stored in the capacitor 300 are finally implemented.

A substrate bias voltage of the second switch 472 may be provided by an output of a substrate bias selection circuit (DBB), and the DBB selects the highest one of a source voltage and a drain voltage of the second switch 472 as the substrate bias voltage.

It should be noted that, in an embodiment of the present disclosure, the first control signal E may be determined by the control unit 469 according to a phase stage of the communication signal TX_VCC. For example, it is assumed that the first switch 471 is active at low level, that is, a switch is turned on when a control signal is at low level. When the TX_VCC is at the negative phase stage, the first switch 471 is turned off; and when the TX_VCC is at the positive phase stage, the first switch 471 is turned on.

However, the second control signal C and the third control signal A may be determined by the control unit 469 according to a phase stage of the communication signal TX_VCC and a comparison result of the first comparator 465 or the second comparator 466. For example, the third switch 473 is turned on at the initial time of the negative phase stage of the communication signal TX_VCC, and the third switch 473 is turned off when the first comparator obtains a comparison result that a potential of the VL is less than a potential of the GND.

It should also be noted that, in an embodiment of the present disclosure, a control signal for driving a switch may be a high current signal that is obtained by amplifying a weak electrical signal through a driver and is capable of driving the switch. For example, as shown in FIG. 4, the control unit may further include a control logic module 467 and a buffer driving circuit 468. Particularly, the control logic module 467 obtains control signals A~E according to the input TX_VCC, a comparison result of the first comparator 465 and a comparison result of the second comparator 466, where the A~E are outputs whose drive is enhanced through the buffer driving circuit 468.

Optionally, as shown in FIG. 4, the second branch 482 may further include a fourth switch 474, the first output end 463 is connected to a device ground GND through the fourth switch 474, the plurality of control signals include a fourth control signal B, and the fourth control signal B is used to turn on the fourth switch 474 when a voltage of the first output end 463 is less than or equal to a voltage of the device ground GND.

Accordingly, it may be ensured that the voltage of the first output end 463 is locked at the voltage of the device ground GND, and thus a recycle rate of a charge stored in the capacitor 300 can be effectively improved.

Optionally, as shown in FIG. 4, the second branch 482 may further include a fifth switch 475, the fifth switch 475 is connected in parallel to two ends of the inductor, the plurality of control signals include a fifth control signal D, and the fifth control signal D is used to turn on the fifth switch 475 at the positive phase stage of the communication signal TX_VCC and to turn off the fifth switch 475 at the negative phase stage of the communication signal TX_VCC.

Accordingly, it can be ensured that the inductor 477 is in a reset state at the positive phase stage of the communication signal TX_VCC until the initial time of the negative phase stage of the TX_VCC, and thus a recycle rate of a charge stored in the capacitor 300 can be effectively improved.

It should be noted that, since the fifth switch 475 in the embodiment of the present disclosure transfers a relatively wide voltage range and has a relative high turnon impedance requirement, a complementary switch design may be adopted, which can avoid the fifth switch 475 from occupying a relatively larger area in a chip.

Optionally, as shown in FIG. 4, the power supply generating circuit 400 further includes a power diode 480 and a first capacitor 490, the pulse generating circuit 460 further includes a second output end 470, the driving voltage generating circuit 410 is connected to the second output end 470 through the power diode 480, and the first output end 463 is connected to the second output end 470 through the first capacitor 490.

It can be understood that, the power diode 480 in an embodiment of the present disclosure may also be in a form of a synchronous switch tube.

It should be understood that, the power diode 480 and the first capacitor 490 in an embodiment of the present disclosure may be the same as or different from the power diode 112 and the first capacitor 113 shown in FIG. 1, respectively, and the embodiment of the present disclosure does not make a specific limit hereof.

It should be noted that, an improvement of the circuit structure shown in FIG. 4 with respect to the circuit structure shown in FIG. 1 lies in replacing the power supply generating circuit 110 in FIG. 1 with the power supply generating circuit 400, that is, the power supply generating circuit 400 includes the driving voltage generating circuit 410 and the pulse generating circuit 460. It should also be understood that, the driving voltage generating circuit 410 shown in FIG. 4 and the VCCL generator 110 shown in FIG. 1 may be the same, a voltage value output by the driving voltage generating circuit 410 may be any value, and its form includes but is not limited to: a low dropout regulator (low dropout regulator, LDO), a boost (Boost) or a charge pump (Charge Pump).

Accordingly, the energy storage end 464 may be connected to a system power supply or another independent energy storage capacitor. The energy storage end 464 may also be connected to at least one module in a terminal device, and an output voltage of the energy storage end 464 serves as a supply voltage of the at least one module. It should be understood that, the energy storage end 464 of an embodiment of the present disclosure may be connected to any module, circuit or unit that needs to be supplied with power, and the embodiment of the present disclosure does not make a specific limit hereof.

Figure 5:
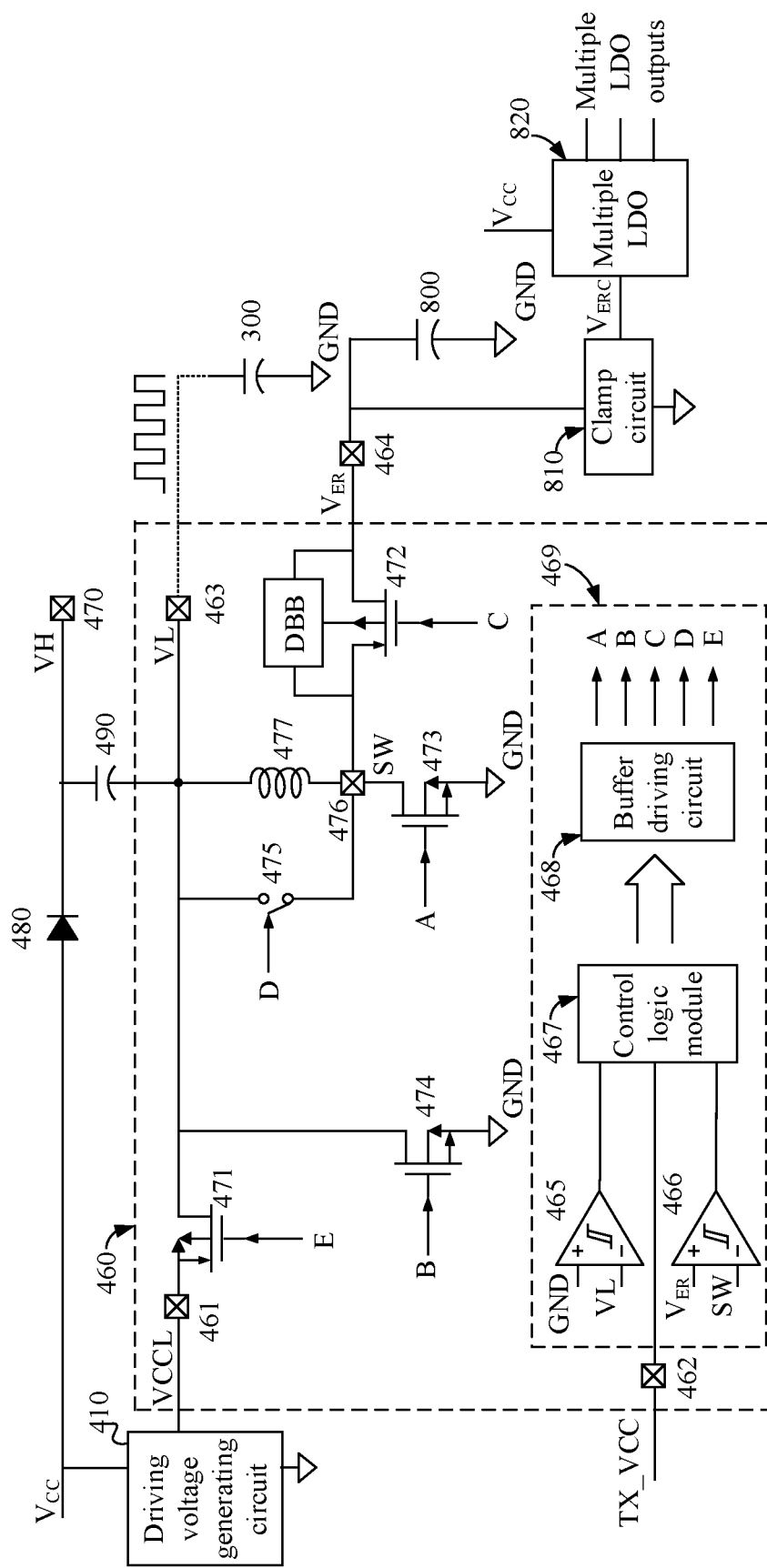
FIG. 5 is a principle diagram of another power supply generating circuit according to an embodiment of the present disclosure.

For example, as shown in FIG. 5, the energy storage end 464 may be connected to a "clamp circuit" 810, a VERC is obtained through the "clamp circuit" 810, and then the VERC is output to a multiple low dropout regular 820 (low dropout regulator, LDO) to obtain a plurality of output voltages that are supplied to other modules of a system for use as power supplies, where an energy storage capacitor 800 is configured to store energy. Accordingly, interference of an energy storage voltage VER with a VH can be avoided, thereby performance of a sensor apparatus is improved.

Figure 6:
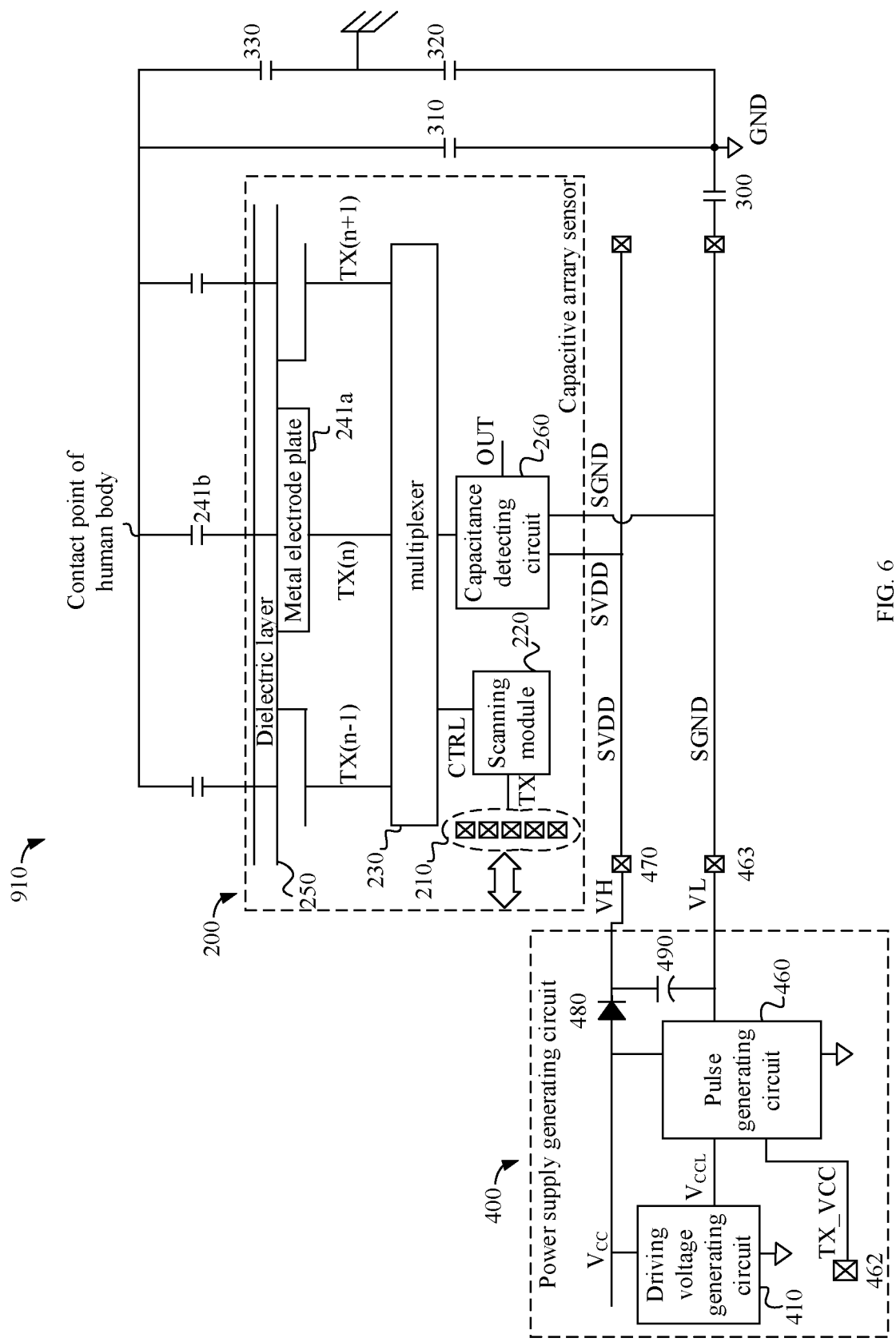
FIG. 6 is a schematic structural diagram of a capacitive array sensor apparatus according to an embodiment of the present disclosure.

FIG. 6 is a schematic circuit diagram of a capacitive array sensing apparatus 910 according to an embodiment of the present disclosure.

As shown in FIG. 6, the capacitive array sensing apparatus 910 includes: a power supply generating circuit 400 and a capacitive array sensor 200, where the capacitive array sensor 200 includes a sensor ground SGND of the capacitor array sensor, a power supply end SVDD and a communication interface 210 of the capacitor array sensor 200, a first output end 463 is connected to the sensor ground SGND, a second output end 470 is connected to the power supply end SVDD, and the second input end 462 is connected to the communication interface 210, and the power supply generating circuit 400 is configured to supply power to the capacitive array sensor 220.

The capacitive array sensor 200 includes a metal electrode plate 241a, a multiplexer 230, a scanning module 220, a dielectric layer 250 and a capacitance detecting circuit 260, the scanning module is connected to the second input end through the communication interface, and the scanning module is connected to the capacitance detecting circuit 260 through the multiplexer 230 and the metal electrode plate 241a. The scanning module 220 is further connected to the power supply generating circuit 400 through the communication interface 210. The capacitive array sensor 200 is configured to generate a second capacitor 241b through the metal plate 241a and a human body, to control the multiplexer 230 through the scanning module 220 to convey a charge in the second capacitor 241b to the capacitance detecting circuit 260, and to detect the charge in the second capacitor 241b through the capacitance detecting circuit 260. Namely, at a negative phase stage of a communication signal TX_VCC, a charge input from a first input end 464 is a charge stored in a capacitor 300 between the sensor ground SGND and a device ground GND.

It should be noted that the communication signal TX_VCC in the embodiment of the present disclosure is a signal that passes through the communication interface and is a signal that has a same frequency and a same phase as that of a detection signal TX. However, a signal amplitude of the communication signal TX_VCC is between GND and VCC, and a signal amplitude of the detection signal TX is between GND and VCC+VCCL. It should also be noted that, a principle of the capacitive array sensor 200 in the embodiment of the present disclosure is a same as that of the capacitive array sensor 200 shown in FIG. 1, and in order to avoid repetition, details are not described redundantly herein.

A process of recycling a charge in an embodiment of the present disclosure will be described in detail below with reference to a timing diagram shown in FIG. 7.

It is assumed that the third switch 473, the fourth switch 474 and a fifth switch 475 shown in FIG. 4 or FIG. 5 are active at high level, that is, a switch is turned on when a control signal is at high level; and the first switch 471 and the second switch 472 are active at low level, that is, the switch is turned on when the control signal is at low level. For convenience of description, 0 is used to indicate low level, and 1 is used to indicate high level in the following.

Figure 7:
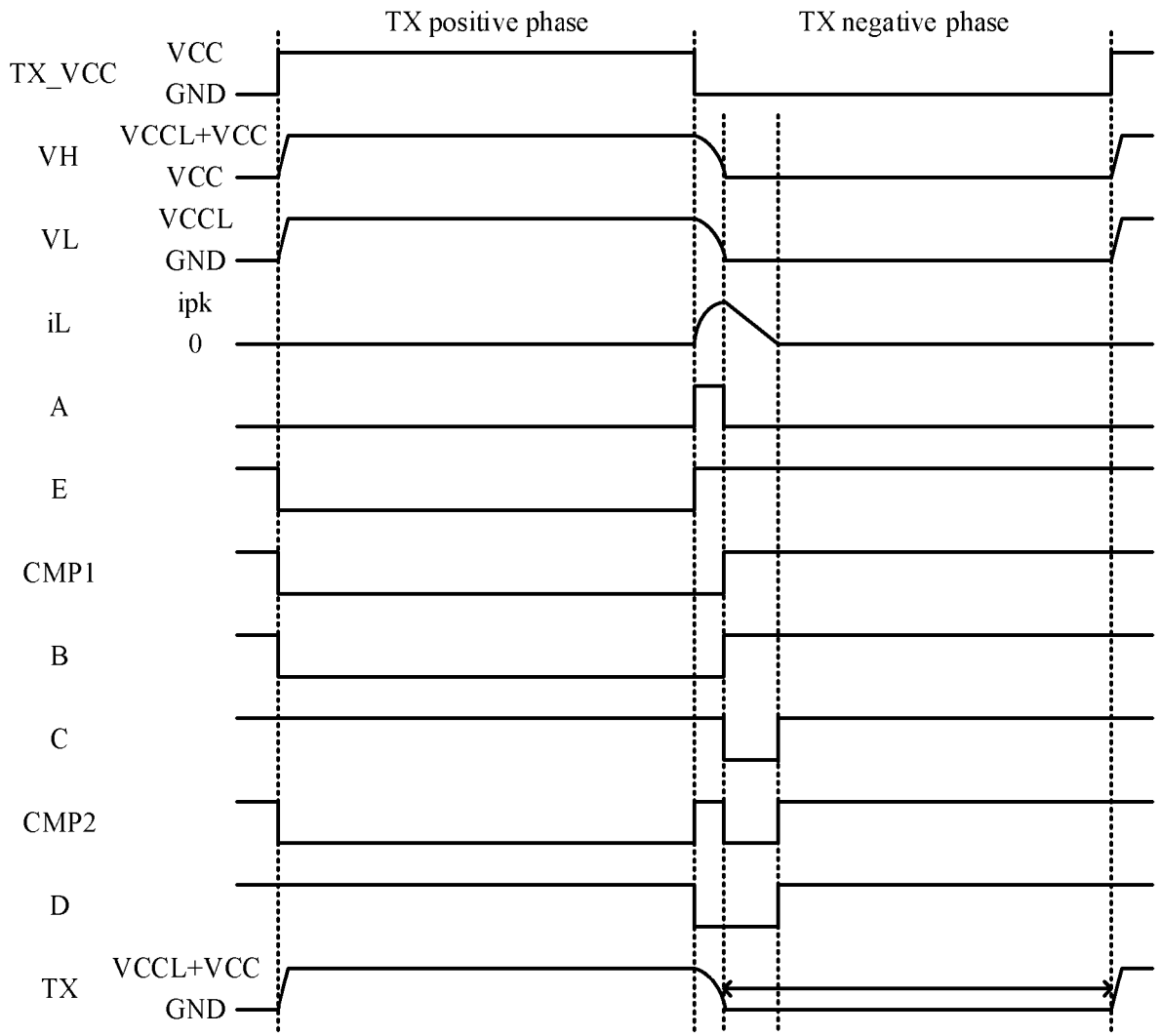
FIG. 7 is a schematic diagram of an operation timing of a power supply generating circuit according to an embodiment of the present disclosure.

As shown in FIG. 7, at a positive phase stage of a TX_VCC, E=0, C=1, A=0, B=0 and D=1, that is, the first switch 471 in a first branch 481 is turned on, level of the TX_VCC rises up to high level, the second switch 472, the third switch 473 and the fourth switch 474 in a second branch 482 are turned off, the fifth switch 475 is turned on, and turning on the fifth switch 475 is to ensure that an inductor 477 is in a reset state at an initial time of a negative phase of the TX_VCC. Accordingly, a voltage of a first output end 463 is pulled up to VCCL (that is, a capacitor 300 is synchronously charged to a VCCL voltage), to form a positive phase stage of a first pulse signal VL. Since the first output end 463 is connected to a second output end 470 through a capacitor 490, voltages of two ends of the capacitor 490 cannot change suddenly, namely, a voltage of the second output end 470 is also synchronously pulled up to VCCL+VCC, to form a positive phase stage of a second pulse signal VH, and at this time, a power diode 480 is turned off. It can be understood that, at the positive phase stage of the TX_VCC, a load of the VH is a capacitive array sensor 200; particularly, the capacitor 490 supplies power to the capacitive array sensor 200 is powered.

When the positive phase stage of the TX_VCC changes to the negative phase stage, the first pulse signal VL needs to be pulled down to a device ground GND. In the prior art, the first pulse signal VL is directly pulled down to the GND through a switch, which results in that a charge stored in the capacitor 300 is directly discharged to the device ground GND, so as to greatly increase power consumption of the sensor.

In an embodiment of the present disclosure, when the positive phase stage of the TX_VCC changes to the negative phase stage, a second branch 482 in a pulse generating circuit 460 starts to operate and transfers a charge stored in the capacitor 300 at the positive phase stage of the TX_VCC to an energy storage end 464, and then the charge is reused, so as to greatly reduce power consumption of the sensor.

Particularly, firstly, when the TX_VCC is at the initial time of the negative phase stage, E=1, C=1, A=1, B=0 and D=0, that is, the first switch 471, the second switch 472, the fourth switch 474 and the fifth switch 475 are turned off, and the third switch 473 is turned on. Accordingly, the capacitor 300 and an inductor 477 are in a parallel resonance state, and the charge in the capacitor 300 is transferred to the inductor 477. Particularly, a current of the inductor 477 rises in a "sine shape", and a resonance point (the first output end 463) decreases in a "cosine shape", so that the charge in the capacitor 300 is transferred to the inductor 477. In addition, turning off the fifth switch 475 is to release a reset state of the inductor 477.

Next, when a voltage level of the first output end 463 is lower than or equal to a voltage level of a GND, E=1, C=0, A=0, B=1 and D=0, that is, the first switch 471 and the fifth switch 475 are kept to be turned off, and the fourth switch 474 is turned on, so that the voltage level of the first output end 463 is locked at the voltage level of the GND; the third switch 473 is turned off, so that a voltage of a first port 476 becomes high; and the second switch 472 is turned on, so that energy stored in the inductor 477 will be discharged to the energy storage end 464.

Subsequently, the inductor 477 continues to charge the energy storage end 464. When the current of the inductor 477 decreases to zero and begins to reverse, that is, a source-drain voltage of the second switch 472 reverses, a second comparator 466 outputs 1, a control logic module 467 responds correspondingly, a value of C becomes 1, the second switch 472 is turned off to prevent a current of the energy storage end 464 from reversely flowing to the device ground GND; in addition, a value of D becomes 1, the fifth switch 475 is turned on, that is, the inductor 477 is reset to prevent the inductor 477 from making LC resonance with a parasitic capacitor of the first port 476.

Finally, a circuit will continue to maintain a state of E=1, C=1, A=0, B=1 and D=1 until the positive phase stage of the TX_VCC arrives. During an operation of the capacitive array sensor 200, the TX_VCC repeatedly switches phases at a certain frequency, the first pulse signal VL and the second pulse signal VH may output "floating ground power supply" signals with a same frequency to the capacitive array sensor 200.

Figure 8:
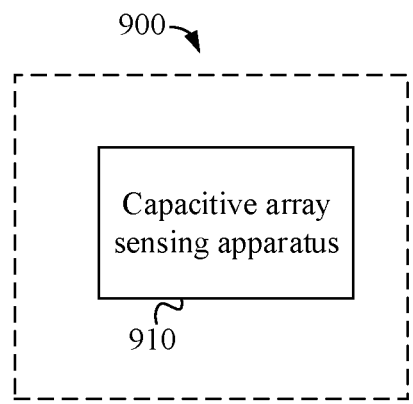
FIG. 8 is a schematic block diagram of a terminal device according to an embodiment of the present disclosure.

It can be understood that, a capacitive array sensing apparatus in an embodiment of the present disclosure may be applied to any form of a terminal device, for example, to a terminal device 900 shown in FIG. 8, and then duration of use of the terminal device 900 can be improved effectively, and user experience is further improved. It should be understood that, the terminal device 900 includes a capacitive array sensing apparatus 910, the capacitive array sensing apparatus 910 may be the sensing apparatus as shown in FIG. 6, and in order to avoid repetition, details are not described redundantly herein.

Those of ordinary skill in the art may be aware that, units and circuits of examples described in the embodiments disclosed in this paper may be implemented by electronic hardware, computer software, or a combination of the two. Whether these functions are executed in hardware or software mode depends on specific applications and design constraint conditions of the technical solutions. Those skilled may implement the described functions by using different methods for each specific application, but this implementation should not be considered to be beyond the scope of the present application.

In several embodiments provided by the present application, it should be understood that the disclosed circuits, branches and units may be realized in other manner. For example, the branches described above are exemplary, e.g., the division of the units is merely a logic function division, other division manners may exist in practical implementation, for example, a plurality of units or components may be combined or integrated to another branch, or some features may be omitted or not implemented.

If the integrated unit is implemented in the form of the software functional unit and is sold or used as an independent product, it may be stored in a computer readable storage medium. Based on such understanding, the technical solutions of the present application substantially, or the part of the present disclosure making contribution to the prior art, or a part of the technical solutions may be embodied in the form of a software product, and the computer software product is stored in a storage medium, which includes multiple instructions enabling computer equipment (which may be a personal computer, a server, network equipment or the like) to execute all of or part of the steps in the methods of the embodiments of the present application. The foregoing storage medium includes a variety of media capable of storing program codes, such as a USB disk, a mobile hard disk, a read-only memory (ROM), a random access memory (RAM), a magnetic disk, an optical disk or the like.

Described above are the specific embodiments of the present application only, but the protection scope of the present application is not limited thereto, those skilled who are familiar with the art could readily think of variations or substitutions within the technical scope disclosed by the present application, and these variations or substitutions shall fall within the protection scope of the present application. Therefore, the protection scope of the present application should be determined with reference to the protection scope of the claims.

What is claimed is:

1. A power supply generating circuit, comprising:
   a driving voltage generating circuit, configured to generate a driving voltage signal; and
   a pulse generating circuit, comprising a first input end, a second input end, a first output end and an energy storage end, wherein the pulse generating circuit receives the driving voltage signal through the first input end and receives a communication signal through the second input end; at a positive phase stage of the communication signal, the pulse generating circuit outputs the driving voltage signal from the first output end; and at a negative phase stage of the communication signal, the first output end does not output the driving voltage signal, and the pulse generating circuit outputs a charge to the energy storage end, wherein the charge is input from the first output end.

2. The power supply generating circuit according to claim 1, wherein the pulse generating circuit comprises: a control unit, a first branch and a second branch, wherein at the positive phase stage of the communication signal, the control unit controls the first branch to output the driving voltage signal from the first output end; and at the negative phase stage of the communication signal, the control unit controls the first branch so that the first output end does not output the driving voltage signal, and controls the second branch to output the charge to the energy storage end, wherein the charge is input from the first output end.

3. The power supply generating circuit according to claim 2, wherein the control unit is configured to generate a plurality of control signals according to the communication signal, and the plurality of control signals are used to control a switch in the first branch and a switch in the second branch.

4. The power supply generating circuit according to claim 3, wherein the first branch comprises a first switch, the driving voltage generating circuit is connected to the first output end through the first switch, the plurality of control signals comprise a first control signal, and the first control signal is used to turn on the first switch at the positive phase stage of the communication signal and to turn off the first switch at the negative phase stage of the communication signal.

5. The power supply generating circuit according to claim 4, wherein the second branch comprises an inductor, a second switch and a third switch, the first output end is connected to the energy storage end through the inductor and the second switch, a first port is disposed between the inductor and the second switch, the first port is connected to a device ground through the third switch, the plurality of control signals comprise a second control signal and a third control signal, the second control signal is used to turn off the second switch at an initial time of the negative phase stage of the communication signal and to turn on the second switch when a voltage of the first output end decreases to a voltage of the device ground, and the third control signal is used to turn on the third switch at the initial time of the negative phase stage of the communication signal and to turn off the third switch when the voltage of the first output end decreases to the voltage of the device ground.

6. The power supply generating circuit according to claim 3, wherein the second branch comprises an inductor, a second switch and a third switch, the first output end is connected to the energy storage end through the inductor and the second switch, a first port is disposed between the inductor and the second switch, the first port is connected to a device ground through the third switch, the plurality of control signals comprise a second control signal and a third control signal, the second control signal is used to turn off the second switch at an initial time of the negative phase stage of the communication signal and to turn on the second switch when a voltage of the first output end decreases to a voltage of the device ground, and the third control signal is used to turn on the third switch at the initial time of the negative phase stage of the communication signal and to turn off the third switch when the voltage of the first output end decreases to the voltage of the device ground.

7. The power supply generating circuit according to claim 6, wherein the control unit comprises a first comparator and a second comparator, the first comparator is configured to compare a potential of the first output end with a potential of the device ground and output a first signal, the second comparator is configured to compare a potential of the energy storage end with a potential of the first port and output a second signal, and the first signal or the second signal is used to control the control unit to generate the plurality of control signals.

8. The power supply generating circuit according to claim 7, wherein a positive phase input end of the first comparator is connected to the device ground, a negative phase input end of the first comparator is connected to the first output end, a positive phase input end of the second comparator is connected to the energy storage end, and a negative phase input end of the second comparator is connected to the first port.

9. The power supply generating circuit according to claim 3, wherein the second branch further comprises a fourth switch, the first output end is connected to a device ground through the fourth switch, the plurality of control signals comprise a fourth control signal, and the fourth control signal is used to turn on the fourth switch when a voltage of the first output end is less than or equal to a voltage of the device ground.

10. The power supply generating circuit according to claim 3, wherein the second branch further comprises a fifth switch, the fifth switch is connected in parallel to two ends of an inductor, the plurality of control signals comprise a fifth control signal, and the fifth control signal is used to turn on the fifth switch at the positive phase stage of the communication signal and to turn off the fifth switch at the negative phase stage of the communication signal.

11. The power supply generating circuit according to claim 10, wherein the third switch, the fourth switch and the fifth switch are turned on when control signals received are at positive phase stages, and the first switch and the second switch are turned on when phase stages of control signals received are negative phase stages.

12. The power supply generating circuit according to claim 1, wherein the power supply generating circuit further comprises a power diode and a first capacitor, the pulse generating circuit further comprises a second output end, the driving voltage generating circuit is connected to the second output end through the power diode, and the first output end is connected to the second output end through the first capacitor.

13. The power supply generating circuit according to claim 1, wherein the energy storage end is connected to a system power supply, or the energy storage end is connected to at least one module in a terminal device through a clamp circuit, and an output voltage of the clamp circuit serves as a supply voltage of the at least one module.

14. A capacitive array sensing apparatus, comprising:
a capacitive array sensor; and
a power supply generating circuit, configured to supply power to the capacitive array sensor, wherein the power supply generating circuit comprising:
a driving voltage generating circuit, configured to generate a driving voltage signal; and
a pulse generating circuit, comprising a first input end, a second input end, a first output end and an energy storage end, wherein the pulse generating circuit receives the driving voltage signal through the first input end and receives a communication signal through the second input end; at a positive phase stage of the communication signal, the pulse generating circuit outputs the driving voltage signal from the first output end; and at a negative phase stage of the communication signal, the first output end does not output the driving voltage signal, and the pulse generating circuit outputs a charge to the energy storage end, wherein the charge is input from the first output end.

15. The capacitive array sensing apparatus according to claim 14, wherein the capacitive array sensor comprises a sensor ground, a power supply end and a communication interface, the first output end is connected to the sensor ground, the second output end is connected to the power supply end, and the second input end is connected to the communication interface.

16. The capacitive array sensing apparatus according to claim 14, wherein at the negative phase stage of the communication signal, the charge input from the first output end is a charge stored in a parasitic capacitor between a sensor ground and a device ground.

17. The capacitive array sensing apparatus according to claim 14, wherein the capacitive array sensor comprises a metal plate, a multiplexer, a scanning module and a capacitance detecting circuit, the scanning module is connected to the second input end through the communication interface, the scanning module is further connected to the capacitance detecting circuit through the multiplexer and the metal plate, and the capacitive array sensor is configured to generate a second capacitor through the metal plate and a human body, to control the multiplexer through the scanning module to convey a charge in the second capacitor to the capacitance detecting circuit, and to detect a capacitance value of the second capacitor through the capacitance detecting circuit.

18. A terminal device, comprising a capacitive array sensing apparatus, wherein the capacitive array sensing apparatus comprising:
a capacitive array sensor; and
a power supply generating circuit, configured to supply power to the capacitive array sensor, wherein the power supply generating circuit comprising:
a driving voltage generating circuit, configured to generate a driving voltage signal; and
a pulse generating circuit, comprising a first input end, a second input end, a first output end and an energy storage end, wherein the pulse generating circuit receives the driving voltage signal through the first input end and receives a communication signal through the second input end; at a positive phase stage of the communication signal, the pulse generating circuit outputs the driving voltage signal from the first output end; and at a negative phase stage of the communication signal, the first output end does not output the driving voltage signal, and the pulse generating circuit outputs a charge to the energy storage end, wherein the charge is input from the first output end.

\* \* \* \* \*